United States Patent [19]

L'Henaff et al.

[11] Patent Number: 4,706,164
[45] Date of Patent: Nov. 10, 1987

[54] PRINTED CIRCUIT CARD WITH HEAT EXCHANGER AND METHOD FOR MAKING SUCH A CARD

[75] Inventors: Patrick L'Henaff, Colomiers; Herve Bricaud, Toulouse, both of France

[73] Assignee: Amphenol Corporation, Wallingford, Conn.

[21] Appl. No.: 838,485

[22] Filed: Mar. 11, 1986

[30] Foreign Application Priority Data

Mar. 18, 1985 [FR] France ................. 85 03970

[51] Int. Cl.$^4$ .................. H02B 1/00; H05K 7/20
[52] U.S. Cl. ........................ 361/382; 361/386
[58] Field of Search ............. 361/380, 381, 382, 383, 361/384, 385, 386, 387, 388; 357/81; 174/16 HS

[56] References Cited

U.S. PATENT DOCUMENTS 3,706,010 12/1972 Laermer .
3,956,673 5/1976 Seid .
4,019,098 4/1977 McCready et al. .
4,268,850 5/1981 Lazarek .................. 174/16 HS

FOREIGN PATENT DOCUMENTS 0090727 10/1983 European Pat. Off. .
3329325 3/1984 Fed. Rep. of Germany .

OTHER PUBLICATIONS

IBM Technical Disclosure Bulletin, vol. 26, No. 2, Jul. 1983, p. 841.

Primary Examiner—Roy N. Envall, Jr.
Attorney, Agent, or Firm—Bacon & Thomas

[57] ABSTRACT

A printed circuit card with built-in heat exchanger. The card includes a mono- or multilayer circuit and heat drain integrated together, and having a system of channels for circulation of a heat-carrying fluid. The channels are formed on a plate and are enclosed by a closure plate.

20 Claims, 5 Drawing Figures

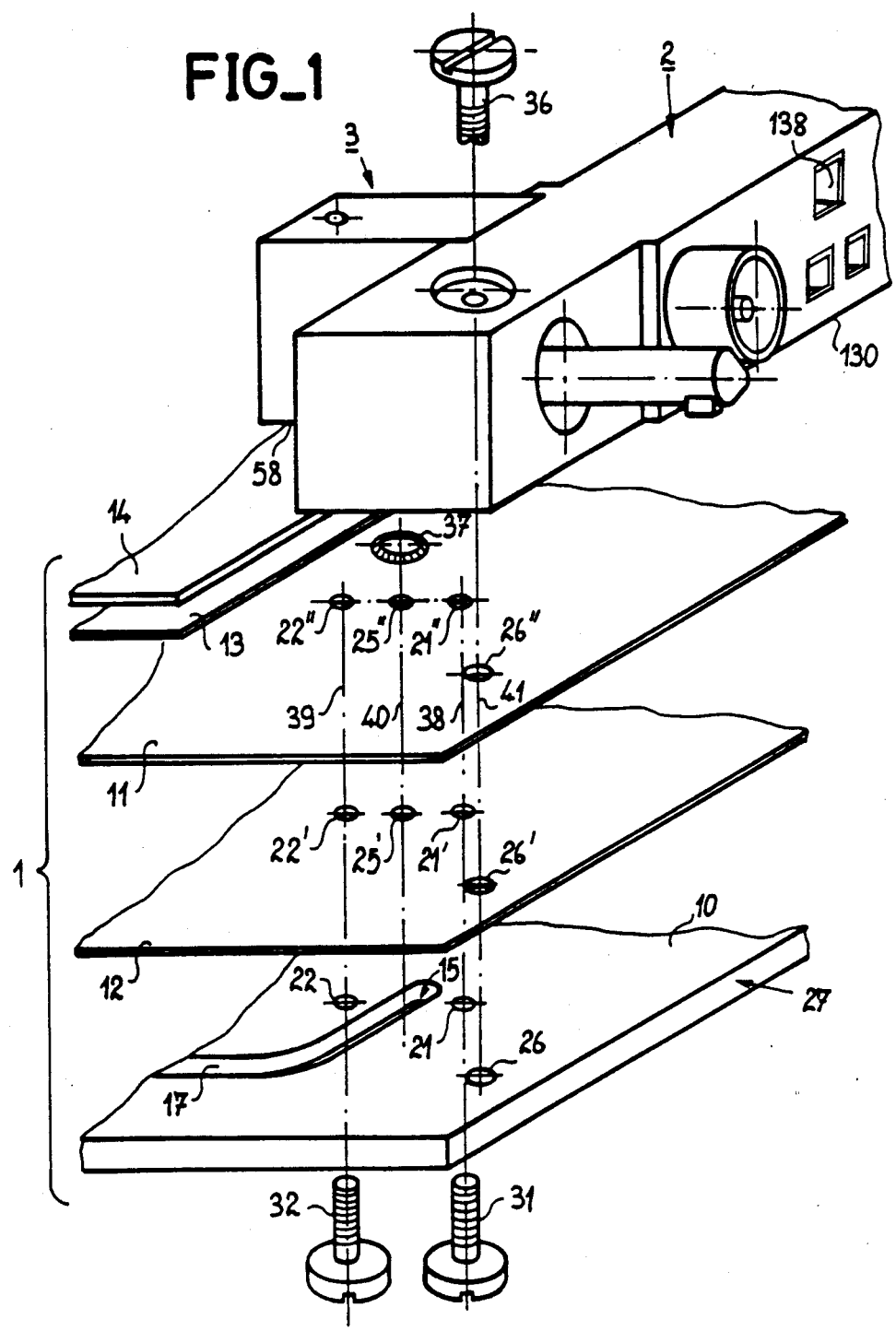

FIG_2
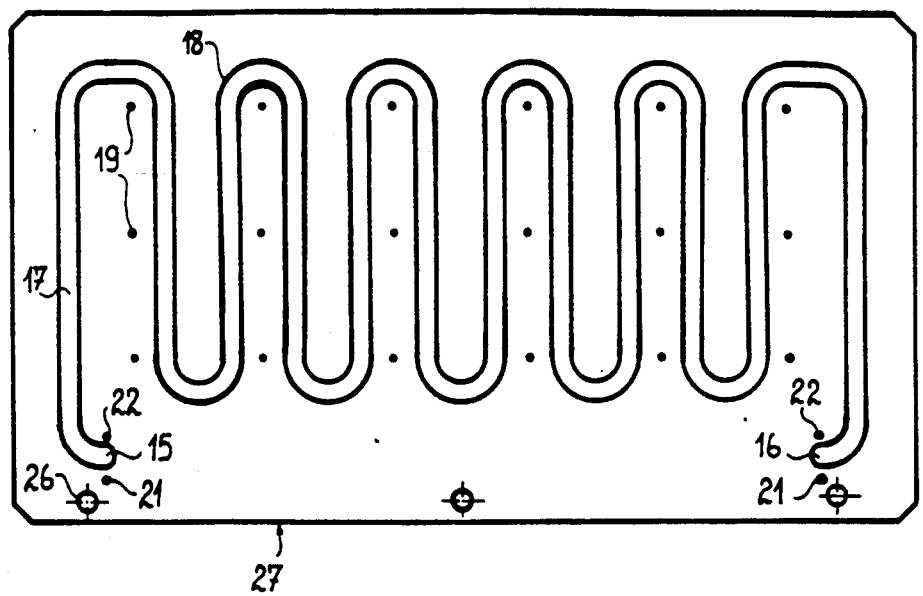
FIG_3
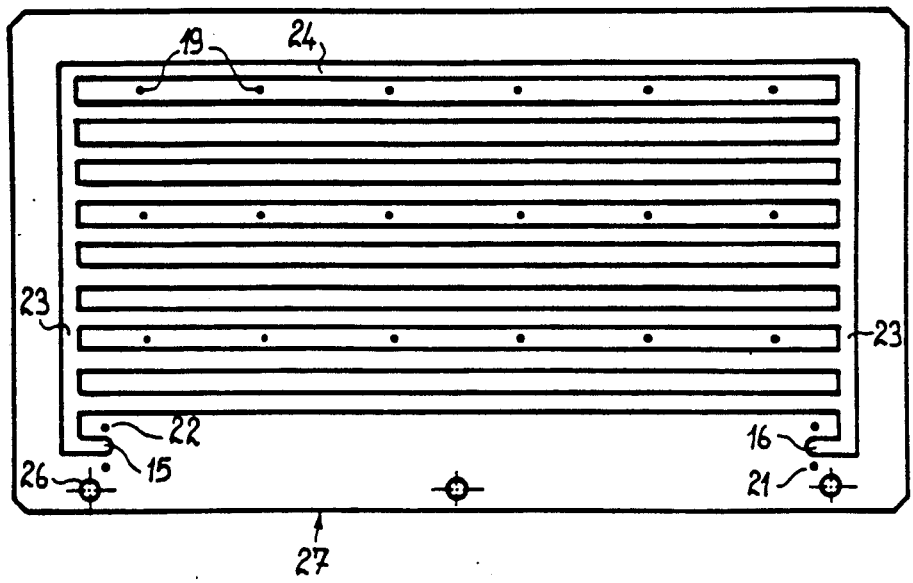

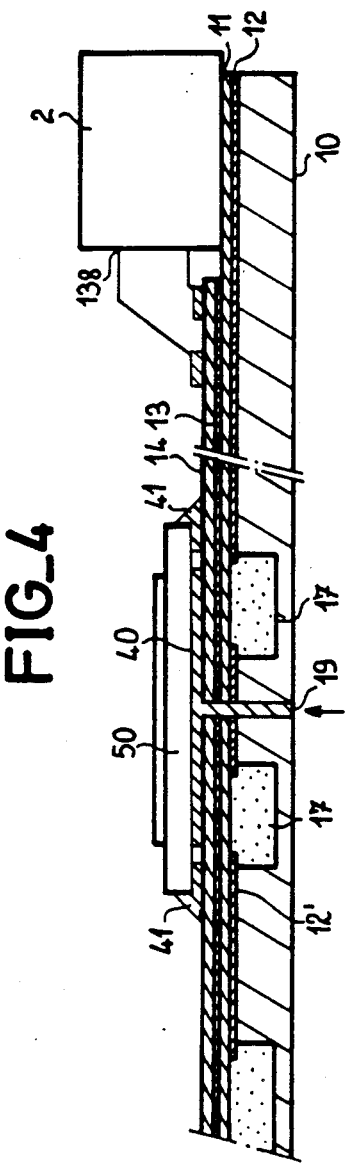
FIG_4
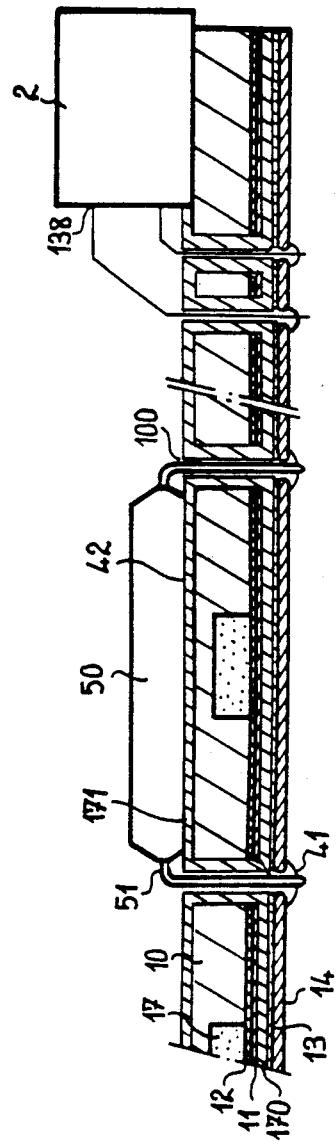
FIG_5

PRINTED CIRCUIT CARD WITH HEAT EXCHANGER AND METHOD FOR MAKING SUCH A CARD

BACKGROUND OF THE INVENTION

1. Field of the Invention

The present invention relates to a printed circuit card with built-in heat exchanger hereinafter called a printed card, and a method for making such a card.

2. Description of the Prior Art

Problems of heat dissipation constantly arise in particular in apparatus or equipment comprising a large number of printed cards provided with electronic components. Among these components, some of them dissipate a substantial amount of heat which should be evacuated under the best possible conditions in order to maintain the said components under acceptable operating conditions.

To remedy this drawback there was proposed, for example, in French Patent Application No. 82 05253, an electric and thermal printed card comprising a heat-conducting drain. This card ensures the transfer of heat by conduction through the drain which is generally made of metal, as far as the lateral edges of the card which are connected thermally to the cold walls of the equipment by means of thermal card-guide connectors, for example. This process, although more effective than the systems of cooling by forced convection used in the past, has a certain number of drawbacks. As a matter of fact, it involves a heat conduction chain comprising a large number of links constituted by:

the coupling resistance Rc of the housing on the printed card, the transverse conduction resistance Rt of the printed card involving the thickness of the drain, and in the case of flat-brazed components, that of the printed circuit, the longitudinal conduction resistance Rl of the drain of the card, a resistance which is directly proportional to the dimensions of the card, the coupling resistance Rf of the lateral edges of the drain on the cold walls of the equipment, and the conduction resistance Rp of the frame of the equipment between the cold walls and the hot well.

Evidently, the sum of the line losses caused by each of the above links encumbers the heat balance of the whole. Furthermore, the conduction resistances Rl, Rf and Rp constitute a limiting constraint for the maximum power available on the card. Likewise, the mutual influence of the heating up of the components of a given card by the bias of the heat-conducting drain produces a temperature gradient along the latter which is unfavorable to the components furthest from the lateral edges of the card.

It would be desirable to remedy this drawback by providing a printed card with built-in heat exchanger having an excellent coefficient of heat exchange between the electronic components of the card and the hot well of the system.

SUMMARY OF THE INVENTION

In accordance with this invention, there is provided a printed card with built-in heat exchanger comprising a mono- or multilayered circuit and a heat drain, such parts being integrated with one another, characterized in that the heat drain comprises a system of channels permitting the circulation of a heat-carrying fluid, the system of channels is constituted by a plate equipped with a network of channels and a closure plate, the two plates being integral with one another.

According to a preferred embodiment, the network of channels can be a series network constituted by a single, continuous channel in the form of curves. But in order to diminish the total loss of pressure head in the channel network of the printed card, the network of channels can also be a parallel network constituted by a plurality of channels parallel to one another and terminating in two lateral channels common to all the channels.

According to another characteristic of the present invention, the closure plate or the plate equipped with the network of channels comprises, at each end of the network of channels, an orifice for connecting the said network to a device supplying the heat-carrying fluid. Preferably, the orifices for connection to the device supplying heat-carrying fluid are provided on at least one edge of the card, a border that also has emplacements for electrical connections.

Thus, the structure of the printed card described above ensures an excellent coefficient of heat exchange by means of a very short chain of conduction between the electronic components of the card and the heat-carrying fluid whose circulation in the channels of the drain permits the transfer of heat units to the outside. In this case, as a matter of fact, the chain of heat conduction is composed of two links, namely the coupling resistance Rc of the housing on the printed card and the transverse conduction resistance Rt of the printed card which involes the thickness of the drain and, in the case of flat-brazed components, that of the printed circuit.

Furthermore, with the card with circulation of the heat-carrying fluid described above, the components are almost disconnected thermally from one another because the heat-carrying fluid heats up very little (on the order of 3° C. for a card dissipating 30 W). Moreover, by acting at the level of the circulation pump of the heat-carrying fluid provided in the device supplying heat-carrying fluid, it is possible to adjust the flow of the fluid to the amount of heat to be evacuated while maintaining a slight spread in its temperature between the input and the output of the card. And finally, the card which is kept with its entire surface at the same temperature as the heat-carrying fluid, is, under similar conditions, cooler than the card with a heat-conducting drain. The heat exchanges, by mutual radiation between the cards placed parallel in a given piece of equipment, are therefore considerably lower, which therefore permits a high density of cards inside a given piece of electronic equipment.

Moreover, the printed card with built-in heat exchanger also permits temperatuare regulation of specific electronic components whose stability of characteristics or performances is essentially linked to the operating temperature. The system of circulation of the heat-carrying fluid can also be used as a means of preheating in the case of certain very special applications such as on-board systems where some or all of the electronic equipment can be at a very low temperature just before it is switched on.

According to another characteristic of the present invention there is provided, between the closure and the plate equipped with the network of channels, an integrating and sealing layer made preferably from an epoxy glass fabric pre-impregnated with, for example, a prepolymer epoxy resin. This layer is used to assemble the closure plate with the plate equipped with the network of channels. According to a preferred embodiment, the integration and sealing layer has a cutout corresponding wholly or in part to the pattern of the network of channels. This cutout increases the section of the channels by the value of the thickness of the fabric and therefore enables the closure plate to be directly in contact with the heat-carrying fluid, which improves the heat exchanges within the card.

The plate equipped with the network of channels is preferably made of metal or a plastic moldable or formable under heat, such as polyethersulfone, polyetherimide or polysulfone, and the closure plate is made of metal. But according to another characteristic of the present invention, the closure plate is constituted by a mono- or multilayered printed circuit embodied on an insulating substrate such as epoxy glass-fabric with one face entirely metallized with copper, for example, the metallized face fitting against the plate equipped with the network of channels. This printed circuit can be the circuit which makes all the electrical interconnections on the card, thereby combining the two functions of closure plate and electrical interconnection plate.

Furthermore, when certain components to be carried on the printed card are mounted in ceramic housings with flat-brazed connection plugs, the plate equipped with channels and the closure plate are made of a material with a coefficient of thermal expansion adapted to that of the ceramic, such as a nickel-iron alloy with 42% nickel.

The present invention also relates to a method for making a printed card as described above. Without going into details which will be referred to below, this method is in general characterized in that the plate equipped with the network of channels is obtained by chemically etching a planar plate in a design corresponding to the format of the card, and to the implantation and the nature of the components which are to be borne on the latter. The network of channels can likewise be machined by milling on a numerically controlled machine when the quantities to be made do not justify the creation of etching tools specific to the design selected. But when the quantities to be produced are very large, it is possible either to mold the plate equipped with the network of channels in a suitable plastic material such as, for example, polyethersulfone, polyetherimide or polysulfone, or to make the plate equipped with the network of channels by a combined punching and stamping operation from a sheet of metal or a plastic shaped under heat.

Furthermore, the plate equipped with the network of channels and the closure plate are integrated with one another either by gluing with an epoxy glue, for example, or by insertion between the two of an epoxy glass fabric of the type pre-impregnated with a prepolymer epoxy resin, the passage in heat of the assembly held under pressure producing the integration of the two plates, and the sealing of the channel network. The corresponding printed circuit is then formed and assembled to this heat drain either by counter-gluing or by the insertion between the two of an integration layer constituted by an epoxy glass fabric of the type preimpregnated with a prepolymer epoxy resin, for example.

BRIEF DESCRIPTION OF THE DRAWINGS

FIG. 1 is an exploded partial view of the constituent elements of the printed card according to the present invention, and of a connection plug.

FIG. 2 is a plan view of an embodiment of the plate equipped with a series network of channels according to the present invention.

FIG. 3 is a plan view of another embodiment of the plate equipped with a parallel network of channels according to the present invention.

FIG. 4 is a partial view in section of the printed card with built-in heat exchanger according to the invention equipped with flat-brazed, thermally coupled components.

FIG. 5 is a partial view in section of the printed card with built-in heat exchanger according to the invention equipped with brazed components with thermally coupled through-connections.

DESCRIPTION OF THE PREFERRED EMBODIMENTS

To facilitate comprehension of the description, the same elements in the figures bear the same reference numbers.

FIG. 1 shows, in exploded view, a printed card 1 with built-in heat exchanger and the plug 2 of the input-output connector of the card and a fluidic contact 3 which can also be mounted in plug 2 of the input-output connector of the card to connect the channel network of the printed card to a device supplying heat-carrying fluid, not shown. Such a fluidic connector is described, for example, in co-filed patent application entitled, "Miniature Fluidic Connector", the disclosure of which is expressly incorporated herein by reference. The printed card 1 according to the present invention includes a plate 10 equipped with a network of channels and a closure late 11. The plate equipped with a network of channels is made, for example, of aluminum or an iron-nickel alloy with 42% nickel if the drain is to have a coefficient of expansion adapted to that of the ceramic. The thickness of plate 10 is preferably about 1.5 mm. The channels 17 cut in plate 10 have a depth of preferably 1 mm and a width of approximately 3 mm. Closure plate 11 has a thickness of preferably about 0.1 mm and is preferably made of iron-nickel alloy for reasons of mechanical strength. Nevertheless, plate 10 equipped with the network of channels and the closure plate 11 can be made of other metals. Plate 10 equipped with the network of channels may also be made of plastic as will be explained below.

In the embodiment represented in FIG. 1, the closure plate is integrated with plate 10 on the side where the channels 17 terminate by means of an integration and sealing layer 12 constituted for example by an impregnated fabric cut out in the same way as plate 11. Moreover, the printed circuit 14 which can be a mono- or multilayer printed circuit produced in known fashion, is integrated with the drain constituted by plates 11 and 10 on the outer face of closure plate 11. It is pointed out, however, that the printed circuit 14 can be integrated with the heat drain constituted by plates 11 and 10 on the outer face of the channel plate 10.

This integration is produced by means of an integration layer 13 constituted by a pre-impregnated fabric cut out in the same way as the printed circuit 14. Moreover at the level of the end 15 of the network of channels 17, the closure plate 11 and the pre-impregnated fabric 12 are provided with holes 25' and 25" respectively for passage of the heat-carrying fluid. The same holes will be made at the level of the other end, not shown, of the network of channels 17. The corresponding holes 25', 25" are aligned on the axis 40 in line with the ends 15, the diameter of the hole 25' being slightly smaller than that of the packing 37 provided between the said hole and the fluidic connector 3. According to another embodiment not shown, the passage hole for the heat-carrying fluid can be made in plate 10 equipped with the channel network. As a matter of fact, the position of the holes is a function of the face of the printed card chosen to carry over the connector plug 2. Moreover, in order to permit connecting the fluidic connector 3 incorporated in the plug 2 of the input-output connector, the border of the heat drain containing the passage holes 25' projects relative to the printed circuit 14. This construction is particularly advantageous in the case of printed cards used with brazed as compared with flat components as shown in FIG. 4.

Furthermore, plates 10 and 11 as well as layer 12 have mechanical passage holes 21, 22, 26, 21', 22', 26' and 21", 22", 26" for screws 31, 32, 36. These passage holes are respectively in the alignment of axes 38, 39, 41 of the unreferenced attachment holes of the fluidic contacts 3 and the insulation 130 of pin 2.

As shown in FIGS. 2 and 3, the network of channels 17 in plate 10 can be embodied in different ways. Thus, FIG. 2 shows a series network of channels embodied by a single continuous course connecting the two ends 15 and 16 in the form of successive curves constituted, for example, by straight portions 17 and curved portions 18. The number of curves is selected in such a way that ends 15 and 16 will be close to the transverse edge 27 corresponding to the side of connector 2. Plate 10 is equipped with holes 19 outside the network of channels. Holes 19, whose diameter is about 1 mm, permit the injection of a heat-conducting paste under the housings of the components as will be explained in more detail below.

FIG. 3 shows another embodiment of the network of channels. In this case, the network of channels is a parallel network. The latter is embodied in the form of a plurality of transverse channels 24, parallel to one another and terminating on either side in two lateral channels 23 common to all the channels 24. This configuration, which makes it possible to divide the flow of fluid among all the transverse channels 24, has the advantage of diminishing the overall loss of pressure head of the channel network of printed card 1.

FIGS. 4 and 5 show partial views in section of a printed card with built-in heat exchanger according to the present invention, on which are mounted electronic components and the output terminals of the electrical contacts 138 of pin 2 of the input-output connector. In the case of FIG. 4, the electronic components and the output terminals of the electrical contacts 138 of plug 2 of the connector are flat-brazed. In this case the plug 2 is mounted on the side of the printed circuit. Consequently, the heat drain constituted by plates 10, 11 and the integration and sealing layer 12 have, on the side of plug 2, namely on the side with the holes for passage of heat-carrying fluid, a part projecting relative to the printed circuit 14. Furthermore, to improve the heat conductivity between component 50, brazed flat by brazes 41 on circuit board 14 and the heat drain, a conventional heat-conducting paste 40, having a heat conductivity superior to that of air, is injected through the holes 19 provided in the printed card.

Note that in the case of FIG. 4, the heat drain need not be insulated electrically because the pre-impregnated fabric 13 ensures electrical insulation between the printed circuit 14 and the drain. In this case the heat conduction chain between the housing and the heat-carrying fluid is constituted by:

the transverse thermal resistance of the closure plate 11 which is very thin (0.1 mm) or that of the bottom wall of the channels in plate 10 when the printed circuit is glued on this side, the transverse resistance of the fabric 13 which is likewise thin (about 0.1 mm), the transverse resistance of the interconnections of the copper paths of the thin printed circuit, and the transverse resistance of the conductive paste injected with a syringe, for example, through the holes 19 under the base of the housings 50 resting on the printed card.

Moreover, the fabric 13, at the level of channels 17, has been cut out, to improve the heat exchange between the components 5 and the heat-carrying fluid.

FIG. 5 shows the case where the components are brazed with the aid of through connections 51 passing through the printed card. In this case printed circuit 14, its integration layer 13, closure plate 11, integration and sealing layer 12 and plate 10 are provided with connection holes 100 for the passage of connections 51. In this case, however, the surface of the drain and the walls of the connection holes have to be insulated electrically. This electrical insulation can be embodied, for example, in the manner described in the French patent application No. 82 05253. Thus, this insulation is embodied by a coating of epoxy resin 17, this coating of insulation preferably having windows 171 leaving the drain bare under the base of the housings 50 of the components. Each of these windows is provided with a thermal paste or packing 42, known in itself and connecting the base of the housing thermally with the fluid circulation drain. The insulation layer is not necessary at the level of the border of plate 10 receiving the plug 2 as shown in FIG. 3. In this case, plug 2 being added on the side of plate 10, the printed circuit and the thermal drain have the same dimensions. As mentioned above, the printed card according to the present invention is intended primarily to be connected to a device supplying heat-carrying fluid. This device which has not been shown and which forms the hot-well of the equipment, is constituted by a reservoir of heat-carrying fluid and a circulation pump. A heat exchanger may complete the circuit. The function of this heat exchanger is to regulate the temperature of the heat-carrying fluid when the latter circulates in closed circuit. However, it is clear that this device is useless in the case of consumable fluid or so-called lost fluid circulation.

Depending on the type of application of the electronic equipment the hot well will be specially designed or can be taken from an available circuit of fluid whose principle function can be, for example:

the oil circuit of mechanical members the cooling circuit of a motor, or the fuel of a motor or reactor.

Depending on the application or on the fluid available, the nature of the heat-carrying fluid circulating in the substrate can be, for example, water; an alcohol such as ethanol, ethyleneglycol, etc.; a fluorocarbon such as trichlorofluoroethylene; lubricating and cooling oils; mineral oils; gasoline; or kerosene.

There will now be described various methods for making the printed card with built-in heat exchanger according to the present invention.

There is first made, separately, a double-face or multi-layer printed circuit of, preferably thin, epoxy glass laminate by a conventional technique, and the heat drain.

The heat drain according to the present invention is obtained as follows. A plate, preferably of metal, is etched by chemical attack to obtain a network of channels in a pattern suited to the format of the card, the implantation and the nature of the components to be borne on the latter. This plate is made of aluminum or an alloy thereof, copper, steel, iron, nickel or titanium, with generally speaking, a coefficient of expansion compatible with that of the ceramics. This plate may also be made of plastic. Then, either simultaneously by chemical attack in the course of the same operation as the etching of the channels, or afterward by drilling done with the aid of the same numerically controlled tape of the drilling machine as the printed circuit associated with it, the mechanical holes and perhaps the connection holes through which the connections of the components of the printed card will pass, are made.

According to other methods of fabrication, the channels can also be machined by milling on numerically controlled machines when the quantities to be produced are small, or, on the contrary, when the quantities to be produced are very large, it is possible to produce the plate equipped with the network of channels by molding a suitable plastic such as, for example, polyethersulfone, polyetherimide or polysulfone, or by a combined operation of punching and stamping from a piece of sheet metal or a sheet of plastic deformed under heat.

Holes are then made in the closure plate, which is generally constituted by a metal plate that may have a controlled coefficient of expansion. These holes are either etched chemically with a mask identical to the one used for the plate equipped with the network of channels, without the channel pattern, or drilled with the aid of the same numerically controlled tape as the one for the printed circuit.

The closure plate can also be embodied by a mono- or multilayer printed circuit produced on epoxy glass fabric, for example, whose face lying against the channel plate is entirely metallized with copper, for example. This printed circuit can be the one that provides all the electrical interconnections of the card, thus combining the two functions of closure plate and electrical interconnection plate.

The closure plate is then assembled with the plate equipped with the network of channels in a known fashion, either by counter-gluing with an epoxy glue, for example, or by inserting between the two an epoxy glass fabric of the type impregnated with a pre-polymer epoxy resin. Under heat and pressure, the integration of the two plates and the sealing of the channel network is achieved. In the case of the second solution, the pre-impregnated fabric will preferably receive a preliminary cutting, corresponding wholly or partly to the pattern of the channel network.

The two holes constituting the input and output orifices for the heat-carrying fluid in the heat drain can be drilled after assembly in order to insure a good positioning relative to the holes for attachment of the connector plug. It is advisable however to make a pilot hole before assembly in order to avoid the phenomena of positive or negative pressure in the channels when the gluing operations are conducted with heat. Depending on the face of the printed card selected for the fluidic connection, the input and output orifices will be drilled either in the closure plate or in the plate equipped with the network of channels.

When the fabrication of the heat drain is completed, the last stage in producing the printed card according to the present invention comprises assembling the drain and the printed circuit. When all the components are flat-brazed on the substrate, the printed circuit is assembled with the heat drain in the same manner as described above for assembly of the closure plate with the channel plate.

When certain components are brazed with connection legs passing through the printed card according to the present invention, the surface of the drain and its connection holes have to be insulated electrically. This electrical insulation can be embodied according to the technique described in the aforementioned French patent application No. 82 05253.

The resulting product is a printed card comprising a network of circulation of heat-carrying fluid placed in parallel on the network of electrical interconnections which retains an exterior aspect identical to that of cards with a conventional heat drain. Its thickness, in particular, is approximately between 1.8 and 2.2 mm. In fact, the techniques used for manufacturing the heat drain permit the embodiment of a heat drain having a thickness equivalent to those of heat-conductive drains. Nevertheless, the printed card according to the present invention permits a considerable improvement in the evacuation of heat dissipated by the components provided on the card. By way of example, the application of the present invention to prototypes of cabinets equipped with cards of format 163×87.5 mm made it possible to verify that the maximum dissipatable power was thus multiplied by:

a factor of 6 relative to that permitted in the same cabinet cooled by natural convection, and a factor of 2 relative to that permitted in the same cabinet cooled by conduction with card plus heat-conducting drain and thermal card-guide connector.

We claim:

1. A printed circuit board assembly, said assembly comprising:

a printed circuit board having circuits thereon:

an electrical connector connected to said board;

said connector including a fluidic contact including means for passage of a cooling liquid therethrough, and a heat drain attached to said board which provides a built-in heat-exchanger for said board, said heat drain comprising:

a first plate having an upper surface and a lower surface.

a network of channels integrally formed in said first plate and extending from said upper surface towards said lower surface and terminating before said lower surface, said channels being adapted to circulate said cooling liquid;

a closure plate extending over said first plate, said closure plate having an upper surface and a lower surface;

at least one orifice extending through said closure plate from its upper surface to its lower surface, said orifice being in communication with said passage means of said fluidic contact;

an integration and sealing layer located between said first plate and said closure plate and connecting and sealing said plates together, said integration and sealing layer having an upper surface and a lower surface; and at least one orifice extending through said integration and sealing layer from its upper surface to its lower surface, said orifice in said integration and sealing layer being in communication with said orifice of said closure plate and said channels of said first plate, whereby a path for said cooling liquid extends from said fluidic contact to said channels to thereby provide an integral heat-exchanger for said printed circuit board.

2. The assembly of claim 1, including a second integration layer integrally connecting said printed circuit board to said upper surface of said closure plate.

3. The assembly of claim 1, wherein said orifice of said integration and sealing layer and said orifice of said closure plate are in alignment with an end of one of said channels in said first plate.

4. The assembly of claim 3, wherein said closure plate is substantially thinner than said first plate.

5. The assembly of claim 4, wherein said sealing and integration layer is substantially thinner than said first plate.

6. The assembly of claim 5, wherein said sealing and integration layer comprises a pre-impregnated glass fabric.

7. The assembly of claim 6, wherein said glass fabric is pre-impregnated with epoxy resin.

8. The assembly of claim 1, wherein said first plate has a transverse edge, and said channels terminate in ends located adjacent to said transverse edge.

9. The assembly of claim 8, wherein said network of channels is a series network formed by a single continuous channel in the form of curves.

10. The assembly of claim 8, wherein said network of channels is a parallel network formed by a plurality of channels parallel to one another, and terminating in two lateral channels common to all channels.

11. The assembly of claim 8, wherein said first plate is provided with a plurality of holes located outside said network of channels for the passage of a heat conducting paste.

12. The assembly of claim 8, wherein said first plate is formed of an iron-nickel alloy with 42% nickel.

13. A printed circuit board assembly adapted for connection with an electrical connector having a fluidic contact which includes means for passage of a cooling liquid to cool said printed circuit board, said assembly comprising:

a printed circuit board having circuits thereon;

a first plate having an upper surface and a lower surface;

a network of channels integrally formed in said first plate and extending from its said upper surface towards its said lower surface and terminating before said lower surface, said channels being adapted to circulate said cooling liquid;

a closure plate extending over said first plate and being connected to said printed circuit board, said closure plate having an upper surface and a lower surface;

at least one orifice extending through said closure plate from its upper surface to its lower surface, said orifice being adapted to be in communication with said passage means of said fluidic contact;

an integration and sealing layer located between said first plate and said closure plate and sealing said plates together, said layer having an upper surface and a lower surface; and at least one orifice extending through said integration and sealing layer from its upper surface to its lower surface, said orifice in said integration and sealing layer being in communication with said orifice of said closure plate and said channels of said first plate, whereby a path for said cooling liquid extends from said fluidic contact to said channels when said connector is mounted to said assembly to thereby provide an integral heat-exchanger for said printed circuit board.

14. The assembly of claim 13, wherein said orifice of said integration and sealing layer and said orifice of said closure plate are in alignment with an end of said channels in said first plate.

15. The assembly of claim 14, wherein said first plate has a transverse edge, and said channels terminate in ends located adjacent to said transverse ends.

16. The assembly of claim 15 wherein said integration and sealing layer comprises a glass fabric pre-impregnated with epoxy resin.

17. The assembly of claim 16, including a second integration layer integrally connecting said printed circuit board to said upper surface of said closure plate.

18. The assembly of claim 16, wherein each of said integration and sealing layer and said closure plate are substantially thinner than said first plate.

19. The assembly of claim 18, wherein said network of channels is a series network formed by a single continuous channel in the form of curves.

20. The assembly of claim 18, wherein said network of channels is a parallel network formed by a plurality of channels parallel to one another, and terminating in two lateral channels common to all channels.

* * * * *